(12) United States Patent
Honda

(10) Patent No.: US 8,966,731 B2
(45) Date of Patent: Mar. 3, 2015

(54) METHOD FOR MANUFACTURING A SWITCHING ELEMENT

(75) Inventor: Tatsuya Honda, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 383 days.

(21) Appl. No.: 13/342,289

(22) Filed: Jan. 3, 2012

(65) Prior Publication Data

US 2012/0100284 A1    Apr. 26, 2012

Related U.S. Application Data

(62) Division of application No. 12/047,883, filed on Mar. 13, 2008, now Pat. No. 8,125,121.

(30) Foreign Application Priority Data

Mar. 26, 2007 (JP) ................................ 2007-078558

(51) Int. Cl.
    *H01L 41/27*         (2013.01)
    *H01L 41/29*         (2013.01)
    (Continued)

(52) U.S. Cl.
    CPC ................ *H01L 41/27* (2013.01); *H01L 41/29* (2013.01); *H05K 3/107* (2013.01); *H05K 3/181* (2013.01);
    (Continued)

(58) Field of Classification Search
    CPC ..... H01L 41/29; H01L 41/27; H01L 41/0986; H01L 27/20; H01L 2057/006; H01L 23/481; H05K 3/107; H05K 3/181; H05K 3/184; H05K 3/1258; G02F 1/1368

USPC ........ 29/594, 25.35, 830, 831, 842, 846, 852; 310/328, 330–332; 252/62.9 PZ
See application file for complete search history.

(56) References Cited

U.S. PATENT DOCUMENTS 4,572,764 A * 2/1986 Fan .............................. 29/846 X
4,697,118 A     9/1987 Harnden et al.
(Continued)

FOREIGN PATENT DOCUMENTS

EP        0 257 929 A2     3/1988
EP        0 963 000 A2    12/1999
(Continued)

OTHER PUBLICATIONS

European Search Report (European Patent Application No. 08004268.2) dated Jun. 20, 2012, 7 pages.

*Primary Examiner* — A. Dexter Tugbang
(74) *Attorney, Agent, or Firm* — Fish & Richardson P.C.

(57) ABSTRACT

A method for manufacturing a switching element which has enough resistance to repeat switching operations and which can be miniaturized and have low power consumption, and a display device including the switching element are provided. The switching element includes a first electrode to which a constant potential is applied, a second electrode adjacent to the first electrode, and a third electrode over the first electrode with a spacer layer formed of a piezoelectric material interposed therebetween and provided across the second electrode such that there is a gap between the second electrode and the third electrode. A potential which is different from or approximately the same as a potential of the first electrode is applied to the third electrode to expand and contract the spacer layer, so that a contact state or a noncontact state between the second electrode and the third electrode can be selected.

4 Claims, 18 Drawing Sheets

(51) Int. Cl.
  *H05K 3/10* (2006.01)
  *H05K 3/18* (2006.01)
  *H05K 3/12* (2006.01)
  *G02F 1/1368* (2006.01)
  *H01L 27/20* (2006.01)
  *H01L 41/09* (2006.01)
  *H01L 23/48* (2006.01)
  *H01H 57/00* (2006.01)

(52) U.S. Cl.
  CPC .............. *H05K 3/184* (2013.01); *H05K 3/1258* (2013.01); *G02F 1/1368* (2013.01); *H01L 27/20* (2013.01); *H01L 41/0986* (2013.01); *H01L 23/481* (2013.01); *H01H 2057/006* (2013.01)
  USPC ................ 29/25.35; 29/594; 29/830; 29/831; 29/846; 252/62.9 PZ

(56) References Cited

U.S. PATENT DOCUMENTS

| | | | |
|---|---|---|---|
| 4,742,263 | A | 5/1988 | Harnden et al. |
| 4,939,401 | A | 7/1990 | Farrall |
| RE33,691 | E | 9/1991 | Harnden et al. |
| 6,204,737 | B1 | 3/2001 | Ellä |
| 6,242,843 | B1 | 6/2001 | Pohjonen et al. |
| 6,392,618 | B1 | 5/2002 | Kimura |
| 6,476,336 | B1 | 11/2002 | Takeuchi et al. |
| 6,515,791 | B1 | 2/2003 | Hawwa et al. |
| 6,546,623 | B2 * | 4/2003 | Caplet et al. ................ 29/852 X |
| 7,420,320 | B2 | 9/2008 | Sano et al. |
| 7,459,833 | B2 | 12/2008 | Kawakubo et al. |
| 7,545,081 | B2 | 6/2009 | Kim et al. |
| 7,633,213 | B2 | 12/2009 | Takayama et al. |
| 7,675,222 | B2 | 3/2010 | Kawakubo et al. |
| 7,679,186 | B2 | 3/2010 | Jung et al. |
| 2005/0242687 | A1 | 11/2005 | Kawakubo et al. |
| 2006/0208612 | A1 | 9/2006 | Takayama et al. |
| 2006/0237229 | A1* | 10/2006 | Sugahara .................... 29/830 X |
| 2007/0120445 | A1 | 5/2007 | Kim et al. |
| 2008/0164237 | A1 | 7/2008 | Kawakubo et al. |
| 2009/0127977 | A1 | 5/2009 | So et al. |

FOREIGN PATENT DOCUMENTS

| | | | | |
|---|---|---|---|---|
| FR | 2 753 565 | A1 | 3/1998 | |
| JP | 01-501186 | A | 4/1989 | |
| JP | 06132758 | A * | 5/1994 | ................... 29/25.35 |
| JP | 09-092909 | A | 4/1997 | |
| JP | 11-174994 | A | 7/1999 | |
| JP | 2000-035591 | A | 2/2000 | |
| JP | 2005-260208 | A | 9/2005 | |
| JP | 2005-268297 | A | 9/2005 | |
| JP | 2005-302711 | A | 10/2005 | |
| WO | 88/01438 | A1 | 2/1988 | |
| WO | 89/07345 | A1 | 8/1989 | |

* cited by examiner

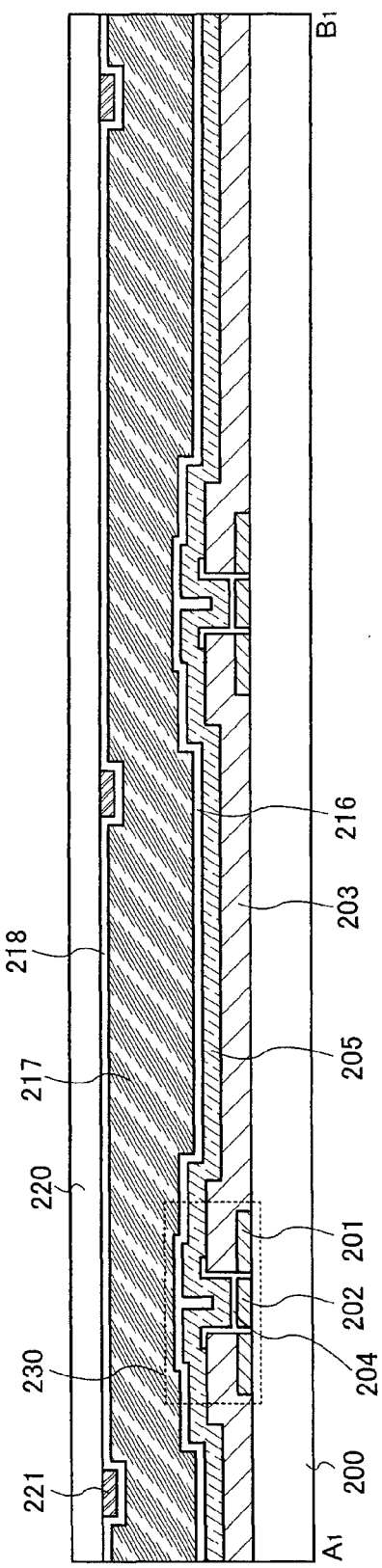
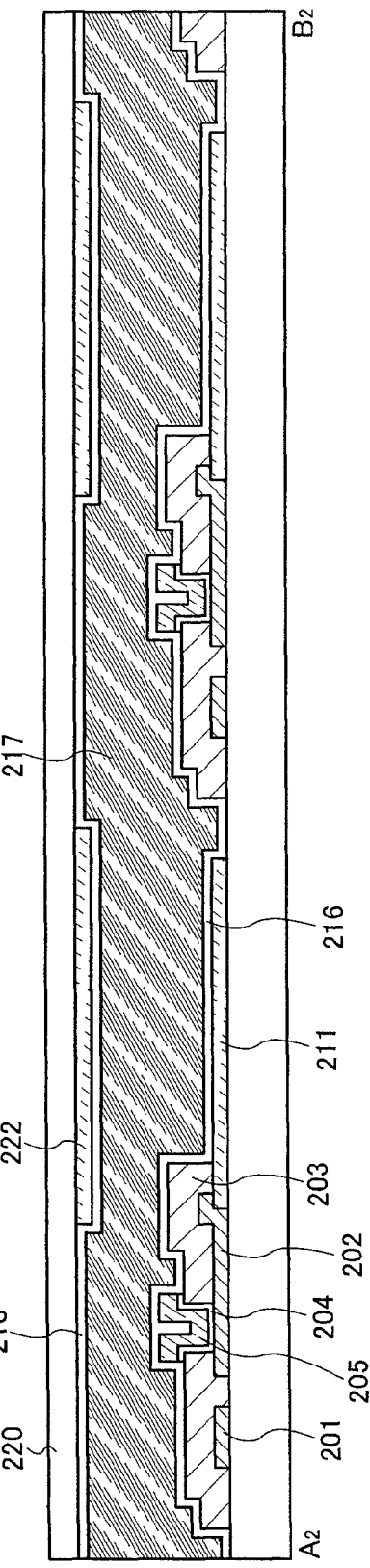
FIG. 5A
FIG. 5B

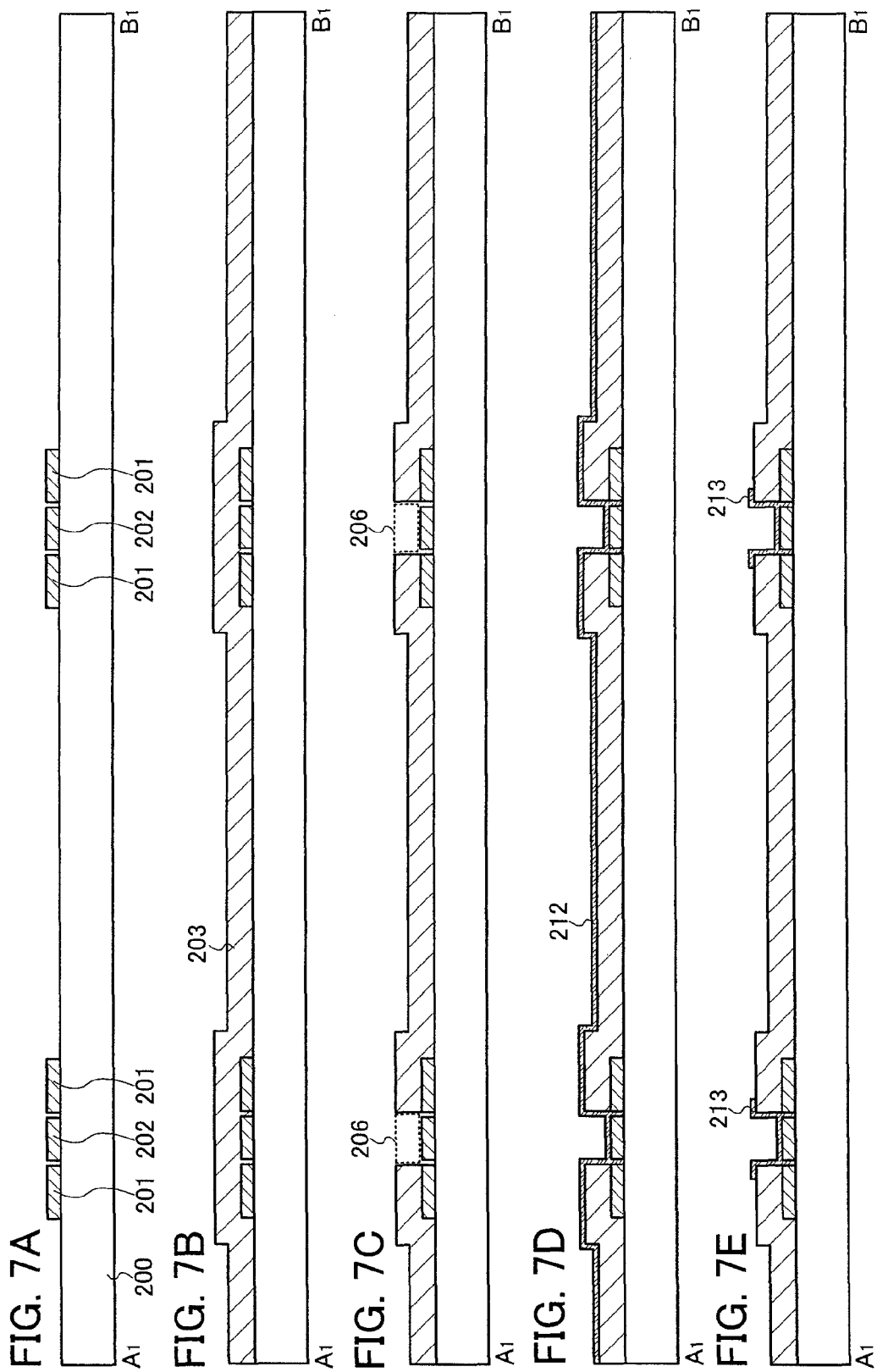

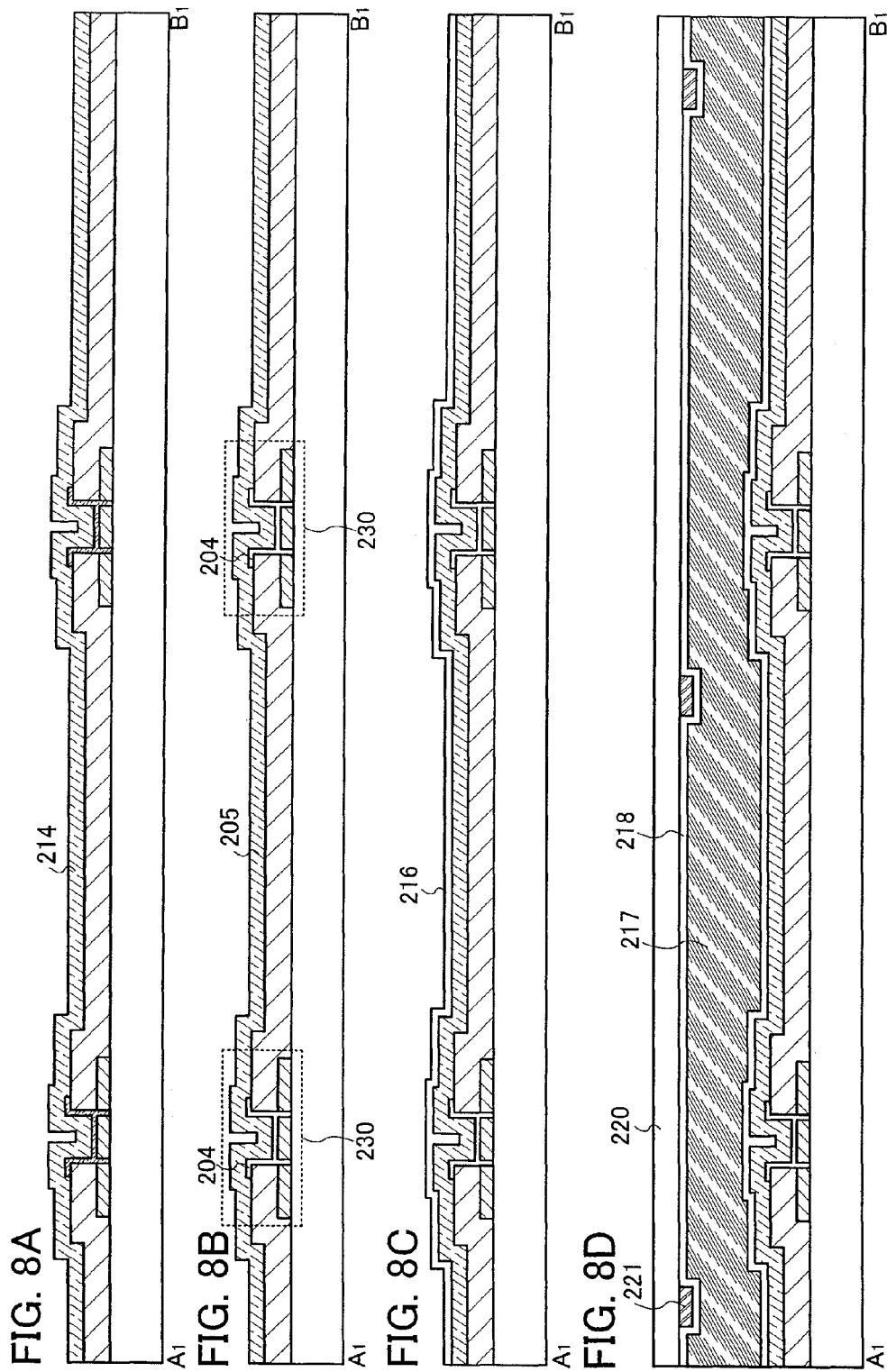

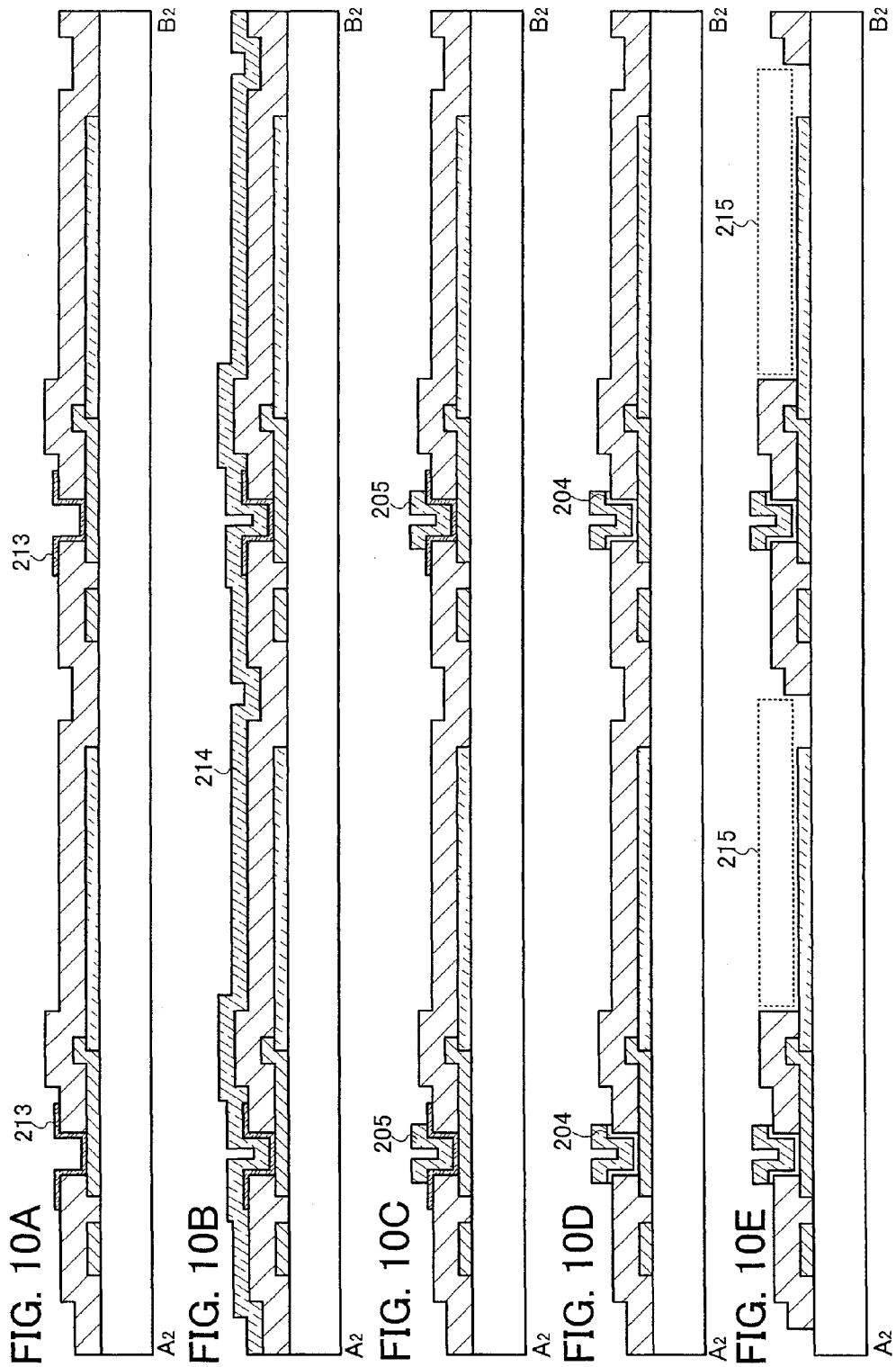

METHOD FOR MANUFACTURING A SWITCHING ELEMENT

CROSS-REFERENCE TO RELATED APPLICATIONS

This application is a divisional of U.S. application Ser. No. 12/047,883, filed Mar. 13, 2008, now U.S. Pat. No. 8,125,121, which claims the benefit of a foreign priority application filed in Japan as Serial No. 2007-078558 on Mar. 26, 2007, both of which are incorporated by reference.

BACKGROUND OF THE INVENTION

1. Field of the Invention

The present invention relates to a switching element, a method for manufacturing a switching element, and a display device including a switching element. In particular, the present invention relates to a display device including a mechanical switch.

2. Description of the Related Art

In recent years, as a display device using a liquid crystal panel or the like, an active-driving display device using thin film transistors (TFTs) is employed in many cases for higher definition. In the case of an active-driving display device, the potential of each pixel electrode can be independently controlled and thus there is no crosstalk such as a leak of an electrical field to an adjacent pixel, as there is in the case of a passive-driving display device; therefore, a panel with less unevenness in display and a higher contrast ratio can be manufactured.

However, active driving has a problem in that because switching on/off of a potential of a pixel electrode is performed electrically using TFTs, an off current (leak current) flows even in an off state and thus it is difficult to maintain a completely off state. When there is an off current, it is difficult to hold a potential of a pixel electrode. Therefore, it is necessary to provide an additional storage capacitor. Further, the higher an off current is, the larger the storage capacitor needs to be. Thus, problems such as lower driving frequency and a flicker in a screen are caused. Further, because it is necessary to supply an excess charge to the storage capacitor, power consumption increases.

In order to solve the above problems, a display device including a mechanical switch as a switching element has been proposed (for example, Cited Document 1: Japanese Published Patent Application No. 119-92909 and Cited Document 2: Japanese Published Patent Application No. 2000-35591). A mechanical switch is operated instead of a switching element such as a transistor, by displacing a fixed flat spring by electrostatic force so that a conductive film (upper electrode) provided at a top portion of the flat spring and a conductive film (lower electrode) such as a pixel electrode are or are not in contact with each other. Further, a display device in which an upper electrode and a pixel electrode come or cease to be in contact with each other depending on contraction of a piezoelectric element has been proposed (for example, Cited Document 3: Japanese Published Patent Application No. H11-174994).

However, in the case where a switching element is provided so as to have a plate structure in which one side is fixed (Cited Document 1), stress is locally concentrated at the time of switching operation of the switching element (a contact or noncontact operation between an upper electrode and a lower electrode); therefore, damage of the switching element is a problem. Similarly, in the case where a flexible thin film and a conductive film are bent with the use of a supporting board to perform a contact or noncontact operation (Cited Document 2), stress is also caused in a specific portion of the flexible thin film; therefore, resistance of an element is a problem. Further, it is necessary to form a somewhat large gap; therefore, it is difficult to miniaturize the switching element.

As for the structure of a piezoelectric switch disclosed in Cited Document 3, even when a switching element is off (an upper electrode and a pixel electrode are not in contact with each other), a potential difference is generated in a piezoelectric element as a signal line which functions as a lower electrode changes, so the switching element cannot be completely turned off, and therefore, malfunction might occur. In particular, in a case where a gap between the upper electrode and the pixel electrode is small, there is a significant possibility that malfunction might occur.

Meanwhile, in the case where the gap is widened to prevent malfunctions, in order that the switching element be turned on, it is necessary for a potential difference between the upper electrode and the lower electrode to be larger, and thus, power consumption of the switching element increases. In this case, a potential difference between a wiring connected to the upper electrode and a wiring connected to the lower electrode is also larger; therefore, there is a possibility that a leak current might occur in a portion where the wirings intersect with each other. Consequently, a display defect might be caused due to reduction in voltage applied to the piezoelectric element as well as increase in power consumption.

SUMMARY OF THE INVENTION

In view of the above problems, an object of the present invention is to provide a switching element which has enough resistance even in the case where switching operations are repeated and which can be miniaturized and have low power consumption, a method for manufacturing the switching element, and a display device including the switching element.

One switching element of the present invention includes a first electrode to which a constant potential is applied, a second electrode provided adjacent to the first electrode, and a third electrode provided over the first electrode and across the second electrode such that there is a gap between the second electrode and the third electrode. A spacer layer formed of a piezoelectric material is between the first electrode and the third electrode. A potential which is different from or approximately the same as a potential of the first electrode is applied to the third electrode to expand and contract the spacer layer, so that a contact state or a noncontact state between the second electrode and the third electrode can be selected.

According to the above-described switching element of the present invention, in the above structure, a potential different from that of the first electrode is applied to the third electrode so that the second electrode and the third electrode come to be in a contact state, and a potential approximately the same as that of the first electrode is applied to the third electrode so that the second electrode and the third electrode come to be in a noncontact state.

One display device of the present invention includes a first electrode to which a constant potential is applied, a second electrode provided adjacent to the first electrode, a third electrode provided over the first electrode and across the second electrode such that there is a gap between the second electrode and the third electrode, and a pixel electrode electrically connected to the second electrode. A spacer layer formed of a piezoelectric material is between the first electrode and the third electrode. A potential which is different from or approximately the same as a potential of the first electrode is applied to the third electrode to expand and contract the spacer layer, so that a contact state or a noncontact state between the second electrode and the third electrode can be selected.

According to the above-described display device of the present invention, in the above structure, a potential different from that of the first electrode is applied to the third electrode so that the second electrode and the third electrode come to be in a contact state, and a potential approximately the same as that of the first electrode is applied to the third electrode so that the second electrode and the third electrode come to be in a noncontact state.

One method for manufacturing a switching element of the present invention includes forming a first conductive film and a second conductive film over a substrate; forming a spacer layer so as to cover the first conductive film and the second conductive film; selectively forming an opening in the spacer layer to expose at least part of the second conductive film; forming a sacrificial layer over part of the spacer layer and the second conductive film at least part of which is exposed; forming a third conductive film so as to cover the sacrificial layer; and removing the sacrificial layer so that a gap is formed between the second conductive film and the third conductive film in the opening.

Another method for manufacturing a switching element of the present invention includes forming a first conductive film and a second conductive film over a substrate; forming a spacer layer so as to cover the first conductive film and the second conductive film; selectively forming an opening in the spacer layer to expose at least part of the second conductive film; forming a conductor in the opening; forming a third conductive film so as to cover the spacer layer and the conductor; and making the conductor aggregate by a heat treatment so that a gap is formed between the conductor and the third conductive film.

According to the present invention, a switching operation (contact or noncontact operation) is performed by expansion and contraction of an insulating film provided between conductive films, and thus, stress is not concentrated in a portion of a switching element; therefore, the element is prevented from being damaged. Further, since expansion and contraction in up and down directions of the insulating film provided between the conductive films are utilized, it is not necessary to widen a gap 104, and therefore, the switching element can be miniaturized. Further, according to the present invention, since a potential difference between a conductive film which functions as an upper electrode and a conductive film which functions as a lower electrode is constant when the switching element is off, malfunctioning of the switching element can be prevented even in a case where the switching element is driven with low power consumption.

BRIEF DESCRIPTION OF THE DRAWINGS

FIGS. 5A and 5B are diagrams each showing a structure of a display device of the present invention.

FIGS. 7A to 7E are diagrams showing an example of a method for manufacturing a display device of the present invention.

FIGS. 8A to 8D are diagrams showing an example of a method for manufacturing a display device of the present invention.

FIGS. 10A to 10E are diagrams showing an example of a method for manufacturing a display device of the present invention.

DETAILED DESCRIPTION OF THE INVENTION

Figure 1A:
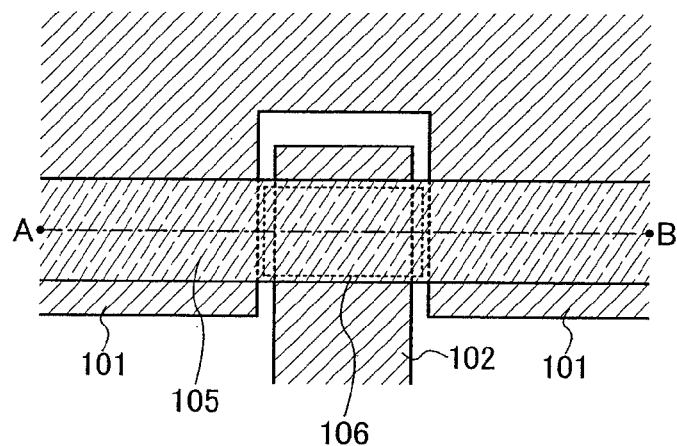
FIGS. 1A to 1C are diagrams each showing a structure of a switching element of a display device of the present invention.

Hereinafter, embodiment modes of the present invention will be described with reference to the accompanying drawings. However, the present invention can be carried out in many different modes, and it will be easily understood by those skilled in the art that various changes and modifications can be made to the modes and their details without departing from the spirit and scope of the invention. Therefore, the present invention should not be construed as being limited to the description in the following embodiment modes. Note that like reference numerals are used to denote common portions and portions having a similar function throughout the drawings for showing the embodiment modes, and description thereof is omitted.

Embodiment Mode 1

In this embodiment mode, a switching element and a display device including the switching element of the present invention will be described with reference to the drawings.

First, the switching element will be described with reference to FIGS. 1A to 1C. Note that FIG. 1A shows a top plan view of the switching element and FIGS. 1B and 1C show cross-sectional views taken along line A-B in FIG. 1A.

Figure 1B:
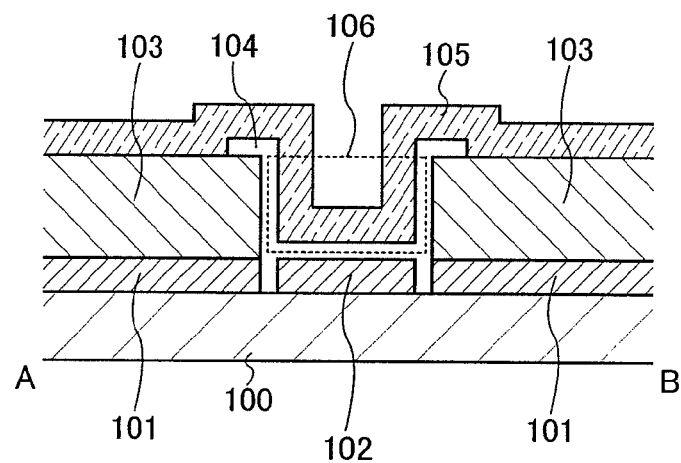
Figure 1C:
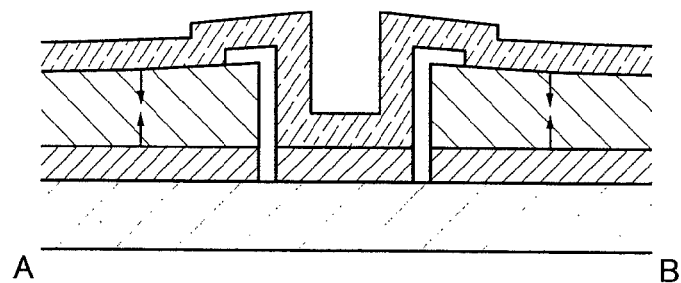

The switching element includes a first conductive film 101 and a second conductive film 102 which are provided over a substrate 100, an insulating film 103 which functions as a spacer layer, a gap 104, and a third conductive film 105 (see FIGS. 1A and 1B). In the switching element, the first conductive film 101 functions as a first electrode (lower electrode), the third conductive film 105 functions as a third electrode (upper electrode), and the second conductive film 102 functions as a second electrode which is or is not in contact with the third electrode.

The first conductive film 101 and the second conductive film 102 are provided over the substrate 100 so as to be adjacent to each other, and the third conductive film 105 is provided over the first conductive film 101 and the second conductive film 102. The insulating film 103 is provided between the first conductive film 101 and the third conductive film 105 at least in a region where the first conductive film 101 and the third conductive film 105 overlap. A region where the insulating film 103 is not formed (opening 106) is provided in part or all of a portion where the second conductive film 102 and the third conductive film 105 overlap.

The third conductive film 105 is provided across the second conductive film 102 such that there is the gap 104 between the second conductive film 102 and the third conductive film 105. In FIGS. 1A to 1C, the third conductive film 105 is provided along the opening 106. In the opening 106, the gap 104 is formed between the second conductive film 102 and the third conductive film 105. Further, in the opening 106, the gap 104 is also formed between the third conductive film 105 and the insulating film 103 which functions as a spacer layer.

A switching element shown in FIGS. 1A to 1C can function as a switch in the following manner. The insulating film 103 expands and contracts so that contact or non contact operation is performed between the second conductive film 102 and the third conductive film 105 (FIG. 1C). Potentials of the first conductive film 101 and the third conductive film 105 are controlled to induce a charge of the first conductive film 101 and the third conductive film 105 and thus to cause compressive stress to the insulating film 103 provided between the first conductive film 101 and the third conductive film 105, so that the insulating film 103 can expand and contract.

For example, when the first conductive film 101 is set to be at a constant potential and a given potential (for example, $V_{in}$) different from the potential of the first conductive film 101 is applied to the third conductive film 105, a charge is induced on the first conductive film 101 and the third conductive film 105 which sandwich the insulating film 103 and thus compressive stress is caused in the insulating film 103, so the insulating film 103 contracts. As a result, the second conductive film 102 and the third conductive film 105 come to be in contact with each other, so the switching element is turned on (contact state), and the second conductive film 102 can be set to be at a potential the same as the potential $V_{in}$ of the third conductive film 105.

In order to turn the switching element off (cause the switching element to be in a noncontact state), a potential of the third conductive film 105 is made approximately equal to a potential of the first conductive film 101. At that time, a potential difference is not generated between the first conductive film 101 and the third conductive film 105 which sandwich the insulating film 103 and thus compressive stress does not work on the insulating film 103, so that the second conductive film 102 and the third conductive film 105 are physically separated to be in a noncontact state. As a result, a leak current does not flow.

When the switching element is off, a potential difference between the third conductive film 105, which corresponds to an upper electrode, and the first conductive film 101, which corresponds to a lower electrode, is maintained constant so that malfunctioning of the switching element can be prevented. Therefore, since the gap 104 between the second conductive film 102 and the third conductive film 105 can be narrow, low power consumption of the switching element can be achieved.

The insulating film 103 which functions as a spacer layer is preferably formed using a material such as a piezoelectric element or an electrostrictive vibrator, which contracts when a voltage is applied. For example, the insulating film 103 can be formed using a piezoelectric material such as a crystal ($SiO_2$) film, a lead zirconate titanate (PZT) film, a lithium niobate ($LiNbO_3$) film, a barium titanate ($BaTiO_3$) film, a lead titanate ($PbTiO_3$) film, a lead metaniobate ($PbNb_2O_6$) film, or a zinc oxide (ZnO) film. Alternatively, the insulating film 103 may be formed using a silicon oxide ($SiO_x$) film, a silicon oxynitride ($SiO_xN_y$, where x>y) film, a silicon nitride ($SiN_x$) film, a silicon nitride oxide ($SiN_xO_y$, where x>y) film, or an aluminum nitride ($AlN_x$) film; or a multilayer film combining a piezoelectric material and any of the above insulating films.

For example, in the structure shown in FIGS. 1A to 1C, a thickness of the insulating film 103 can be 0.1 to 10 μm and the gap between the second conductive film 102 and the third conductive film 105 can be 0.001 to 1 μm in the opening 106. The thickness and the gap of the insulating film 103 may be set based on the amount of contraction of the material of the insulating film 103 and the potential of the third conductive film 105.

Thus, the insulating film provided between the conductive films expands and contracts so that switching operation (contact or noncontact operation) is performed; therefore, stress is not concentrated in a portion of the switching element, so that damage to the element can be prevented. Even in a case where contact and noncontact operations are repeated, rebound of the conductive film 105 and deterioration of the element can be prevented, and thus reliability of the switching element can be improved. Since expansion and contraction in up and down directions of the insulating film 103 are utilized, it is not necessary for the gap 104 to be wide and the switching element can be miniaturized. Further, when the switching element is off, a potential difference between a conductive film, which corresponds to an upper electrode, and a conductive film, which corresponds to a lower electrode, is set to be constant, so that malfunctioning of the switching element can be prevented even in the case where the switching element is driven with low power consumption.

Further, the switching element described in this embodiment mode is more efficient than a conventional mechanical switch in the following respect.

Figure 18A:
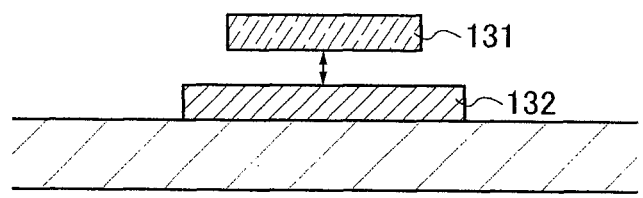
FIGS. 18A to 18C are diagrams showing problems of a conventional switching element.
Figure 18B:
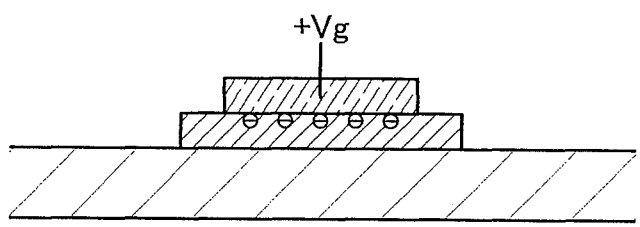
Figure 18C:
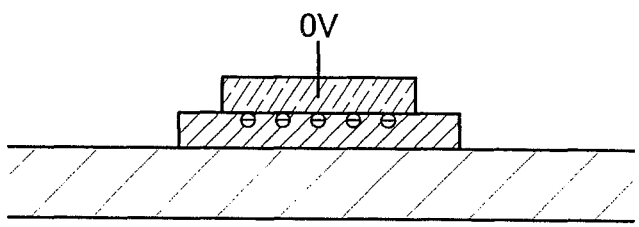

A conventional switching element performs switching operation by using electrostatic force between an upper electrode 131 and a lower electrode 132 (see FIG. 18A). For example, when a given potential ($+V_g$) is applied to the upper electrode 131, a negative charge is induced on a surface of the lower electrode 132, and the upper electrode 131 and the lower electrode 132 come to be in contact with each other due to electrostatic force, so the switching element is turned on (see FIG. 18B). Next, in order to turn the switching element off (to cause the upper electrode 131 and the lower electrode 132 to not be in contact with each other), the upper electrode 131 is set to be at a given potential (for example, 0 V); however, there has been a problem in that in a case where the potential of the lower electrode 132 is not constant and varies, a charge is not discharged from the lower electrode 132, and therefore, the upper electrode 131 and the lower electrode 132 remain in contact with each other, so the switching element is not turned off (see FIG. 18C).

Meanwhile, in a case where the switching element described in this embodiment mode is off, a potential of the first conductive film 101 corresponding to a lower electrode is maintained at a given potential (for example, $V_{com}$) and a potential of the third conductive film 105 corresponding to an upper electrode is set to $V_{com}$, and thus a charge does not remain accumulated in an electrode. Therefore, there is no possibility that problems such as those described above will be caused, and therefore the switching element can be reliably turned off.

Figure 2A:
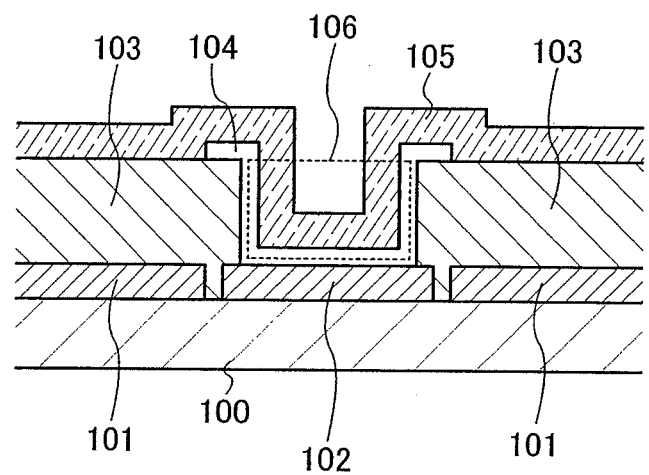
FIGS. 2A and 2B are diagrams each showing a structure of a switching element of a display device of the present invention.
Figure 2B:
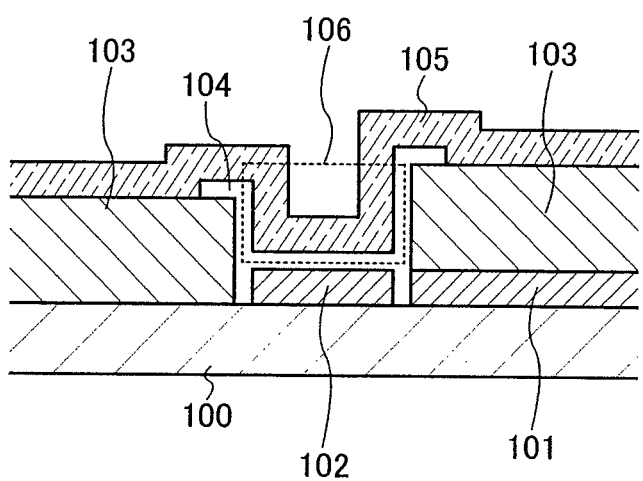

Note that the structure of the switching element described in this embodiment mode is not limited to that in FIGS. 1A to 1C. Although a structure is employed in which the gap 104 is also formed between the first conductive film 101 and the second conductive film 102 which are arranged over a substrate in FIGS. 1A to 1C, alternatively, a structure may be employed in which the insulating film 103 covers gaps between the first conductive film 101 and the second conductive film 102 and end portions of the second conductive film 102 (FIG. 2A). Further, although a structure in which the first conductive film 101 is provided so as to partly surround the second conductive film 102 is shown in FIGS. 1A to 1C, a structure may be employed in which the first conductive film 101 is provided only on one side of the second conductive film 102 (FIG. 2B).

Figure 3A:
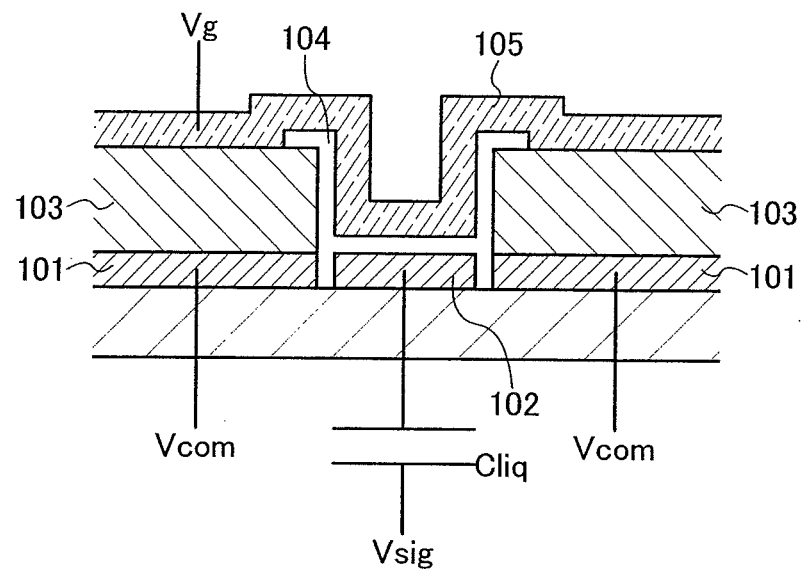
FIGS. 3A and 3B are diagrams showing a driving method of a display device of the present invention.
Figure 3B:
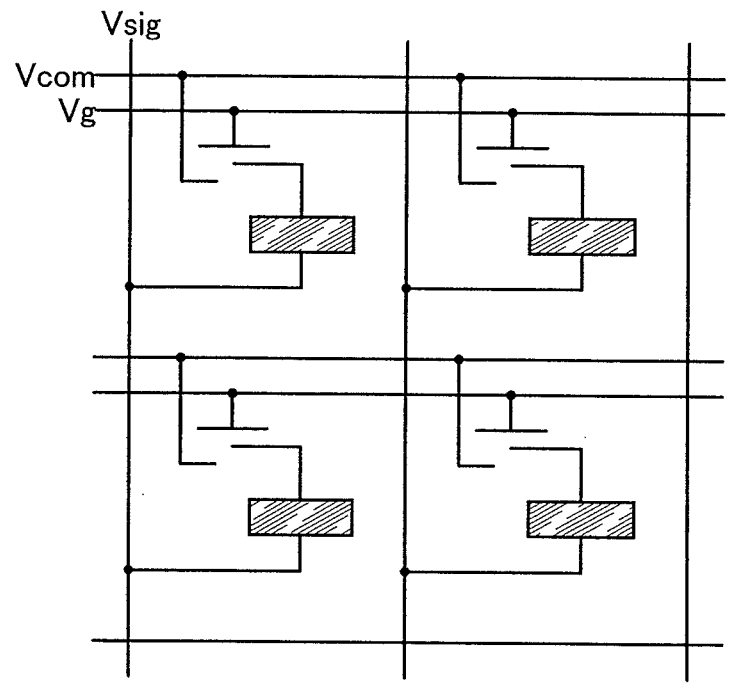

Next, an example of a driving method of a display device which uses the switching element shown in FIGS. 1A to 1C is described with reference to FIGS. 3A and 3B. FIGS. 3A and 3B show schematic diagrams of a driver circuit of the display device using the switching element shown in FIGS. 1A to 1C. Note that here, a structure is described in which a pixel electrode is connected to the second conductive film 102 and a data line is connected to a counter electrode provided so as to face the pixel electrode. Further, while FIGS. 3A and 3B show a liquid crystal display device provided with a liquid crystal material which is between the pixel electrode and the counter electrode, the present invention is not limited to this.

First, the potential of the first conductive film 101 which can function as a common line is maintained at a common line potential $V_{com}$ and a gate line potential $V_g$ is applied to the third conductive film 105 which can function as a gate line, so the switching element is turned on (the second conductive film 102 and the third conductive film 105 come to be in contact with each other). Note that a data line potential $V_{sig}$ is applied to the counter electrode.

In this case, the potential of the pixel electrode connected to the second conductive film 102 is $V_g$, and thus a potential ($V_{sig}-V_g$) is applied to liquid crystal materials provided between the pixel electrode and the counter electrode. As a result, alignment of the liquid crystal materials changes in accordance with the potential ($V_{sig}-V_g$).

Next, the potential of the third conductive film 105 is made equal to the common line potential $V_{com}$ and thus there is no (or little) potential difference between the first conductive film 101 and the third conductive film 105, so the switching element is turned off (the second conductive film 102 and the third conductive film 105 cease to be in contact with each other). When the switching element is off, the second conductive film 102 and the pixel electrode are in a floating state; therefore, the potential difference ($V_{sig}-V_g$) is maintained until the switching element is next turned on.

By thus using the switching element, the alignment of the liquid crystal materials of each pixel provided in the display device can be controlled. Further, the potential ($V_{sig}-V_g$) applied to the liquid crystal materials is varied by changing $V_{sig}$, and thus analog gray-scale display is possible.

Note that the switching element and the display device including the switching element, which are described above, can be implemented by being combined with any one of the structures of the switching element or the display device which are described in other embodiment modes in this specification.

Embodiment Mode 2

In this embodiment mode, the structure of the display device including the switching element described in the above embodiment mode and a method for manufacturing the display device are described with reference to the drawings.

First, the structure of the display device described in this embodiment mode is described with reference to FIGS. 4 to 5B. Note that FIG. 4 shows a top plan view of a pixel in the display device, FIG. 5A shows a cross-sectional view taken along line A1-B1 in FIG. 4, and FIG. 5B shows a cross-sectional view taken along A2-B2 in FIG. 4.

Figure 4:
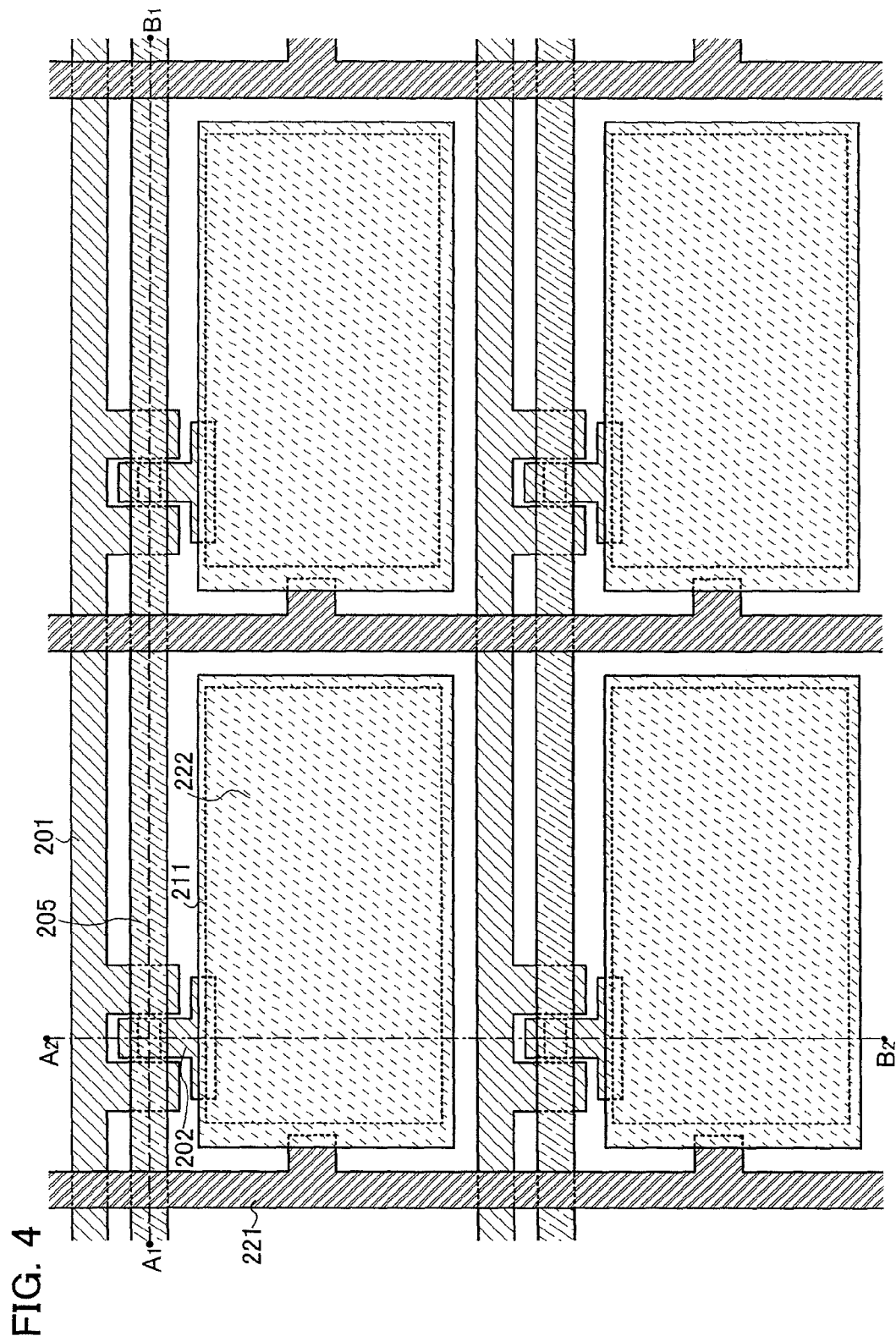
FIG. 4 is a diagram showing a structure of a display device of the present invention.

The display device described in this embodiment mode includes a conductive film 205 which can function as a gate line, a conductive film 201 which can function as a common line, a pixel electrode 211, a conductive film 202 which is electrically connected to the pixel electrode 211, a conductive film 221 which can function as a data line, and a counter electrode 222 which is electrically connected to the conductive film 221 (see FIG. 4). A switching element 230 includes the conductive film 201, the conductive film 202, an insulating film 203, the conductive film 205, and a gap 204 (see FIG. 5A). In the switching element 230, the conductive film 201 corresponds to a first electrode (lower electrode), the conductive film 202 corresponds to a second electrode, the conductive film 205 corresponding to a third electrode (upper electrode), and the insulating film 203 corresponds to a spacer layer. As the structure of the switching element 230, any of the structures described in the embodiment modes in this specification can be employed.

The conductive film 201, the conductive film 202, and the pixel electrode 211 are provided over the substrate 200, and the insulating film 203 is provided so as to cover the conductive film 201 and part of the conductive film 202. In addition, the conductive film 205 is provided over the insulating film 203, and a region where the insulating film 203 is not formed (opening) is provided in part or all of a region where the conductive film 202 and the conductive film 205 overlap.

An alignment film 216 is provided so as to cover the pixel electrode 211, and a liquid crystal material 217 is provided between the alignment film 216 and an alignment film 218 provided on the counter substrate 220. Note that the counter substrate 220 is provided with the conductive film 221 and the counter electrode 222, and the alignment film 218 is provided so as to cover the conductive film 221 and the counter electrode 222 (see FIGS. 5A and 5B).

Figure 6A:
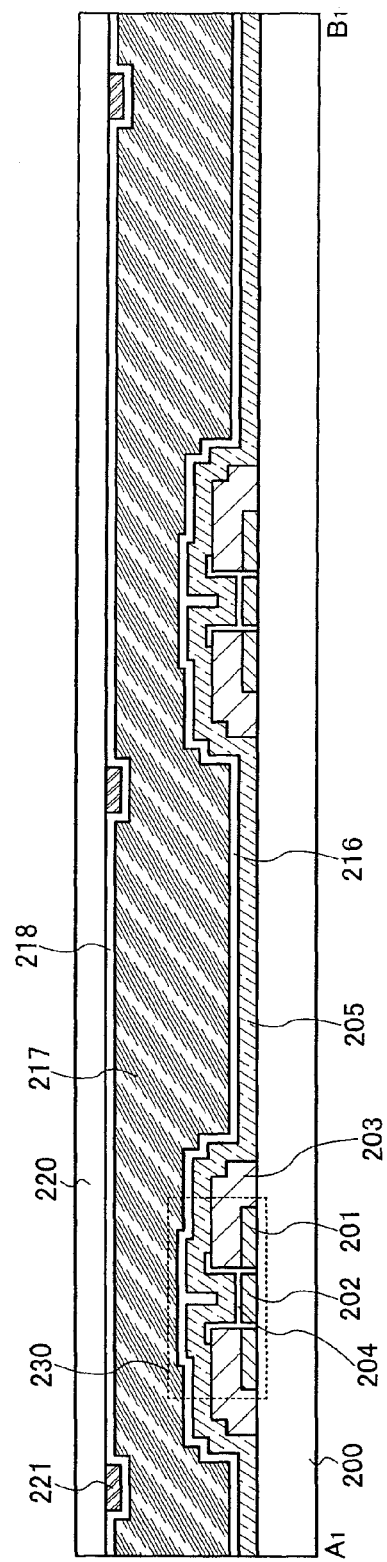
FIGS. 6A and 6B are diagrams each showing a structure of a display device of the present invention.
Figure 6B:
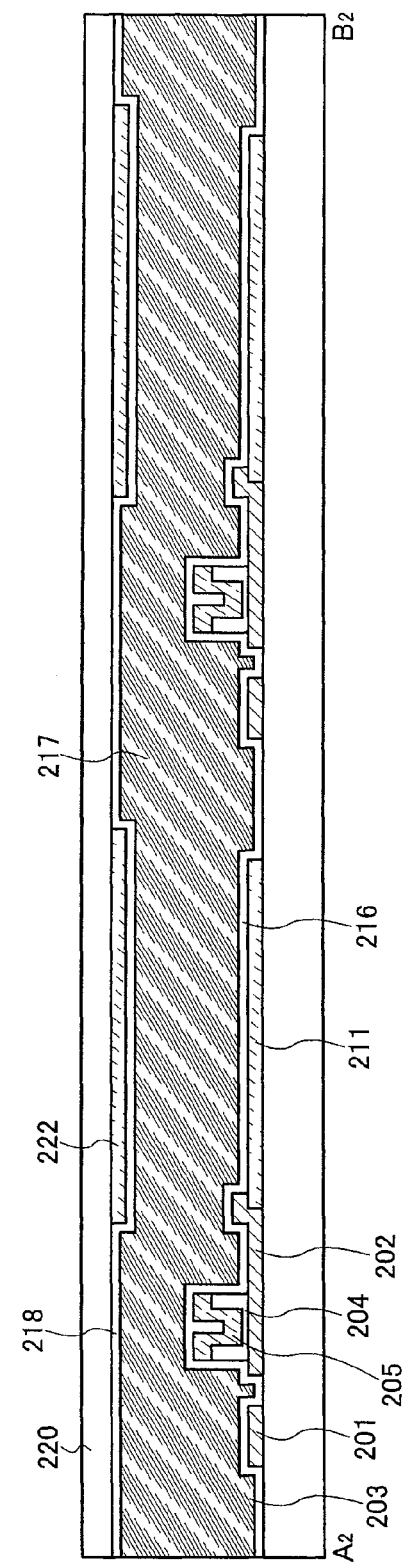

Note that the insulating film 203 may have a structure in which it is provided between the conductive film 201 and the conductive film 205 in a region where at least the conductive film 201 and the conductive film 205 overlap with each other, and it is also possible that the insulating film 203 is not provided in a region other than this region (see FIGS. 6A and 6B).

Next, the method for manufacturing the switching element and the display device including the switching element is described with reference to the drawings. Note that in a following description, FIGS. 7A to 8D each show a cross-sectional view taken along line A1-B1 in FIG. 4, and FIGS. 9A to 11B each show a cross-sectional view taken along A2-B2 in FIG. 4.

Figure 9A:
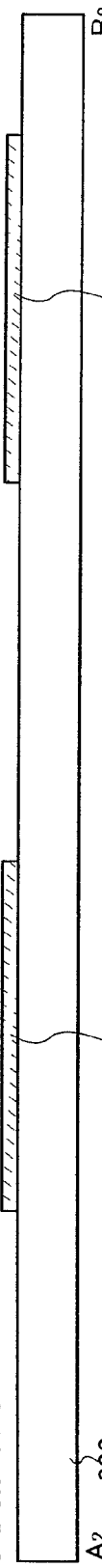
FIGS. 9A to 9E are diagrams showing an example of a method for manufacturing a display device of the present invention.

First, the pixel electrode 211 is selectively formed over the substrate 200 (see FIG. 9A).

As the substrate 200, a light-transmitting substrate such as a glass substrate, a quartz substrate, or a plastic substrate can be used. For the pixel electrode 211, an indium tin oxide (ITO) film in which indium oxide is added with tin oxide, an indium tin silicon oxide film in which indium tin oxide (ITO) is added with silicon oxide, an indium zinc oxide (IZO) film in which indium oxide is added with zinc oxide, a zinc oxide film, a tin oxide film, or the like can be used.

Figure 9B:
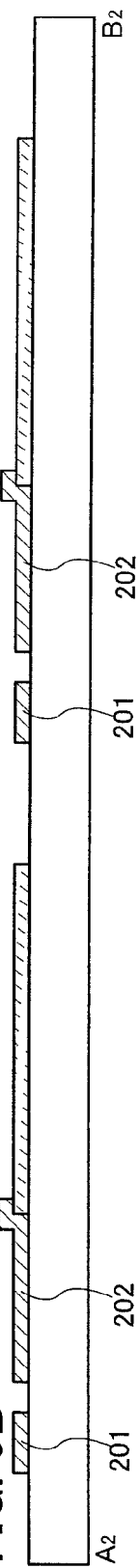

Next, the conductive film 201 and the conductive film 202 are selectively formed over the substrate 200 (see FIGS. 7A and 9B). The conductive film 202 is provided so as to be electrically connected to the pixel electrode 211. The conductive film 201 and the conductive film 202 may be provided in the following manner. A conductive film is formed on an entire surface by a CVD method, a sputtering method, or the like and then is selectively etched. Alternatively, the conductive film 201 and the conductive film 202 may be selectively provided by a droplet discharging method.

Each of the conductive film 201 and the conductive film 202 is formed to have a single-layer structure or a stacked-layer structure using an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), and silicon (Si), or an alloy material or a compound material containing any of the above elements as its main component.

Note that while a case where the pixel electrode 211 is formed and then the conductive film 202 is provided so as to be electrically connected to the pixel electrode 211 is described here, it is also allowed that the conductive film 201 and the conductive film 202 are formed and then the pixel electrode 211 is formed.

Figure 9C:
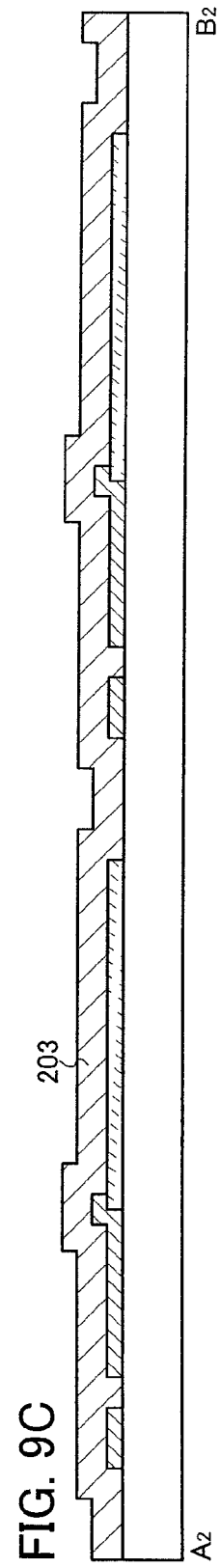

Next, the insulating film 203 is formed so as to cover the conductive film 201, the conductive film 202, and the pixel electrode 211 (see FIGS. 7B and 9C). Functioning as a spacer layer in a switching element to be completed later, the insulating film 203 is preferably formed using a material such as a piezoelectric element which contracts by voltage application. Therefore, the insulating film 203 may be formed using a crystal ($SiO_2$) film, a lead zirconate titanate (PZT) film, a lithium niobate ($LiNbO_3$) film, a barium titanate ($BaTiO_3$) film, a lead titanate ($PbTiO_3$) film, a lead metaniobate ($PbNb_2O_6$) film, a zinc oxide (ZnO) film, or the like. Alternatively, the insulating film 203 may be formed using a silicon oxide ($SiO_x$) film, a silicon oxynitride ($SiO_xN_y$, where x>y) film, a silicon nitride ($SiN_x$) film, a silicon nitride oxide ($SiN_xO_y$, where x>y) film, or an aluminum nitride ($AlN_x$) film; or a multilayer film combining a piezoelectric material and any of the above insulating films.

Figure 9D:

Next, part or all of the insulating film 203 formed over the conductive film 202 is selectively etched so that an opening 206 is formed (see FIGS. 7C and 9D). The opening 206 is formed at least in part or all of a portion where the conductive film 202 and the conductive film 205 to be formed later, which can function as a gate line, overlap with each other.

Figure 9E:
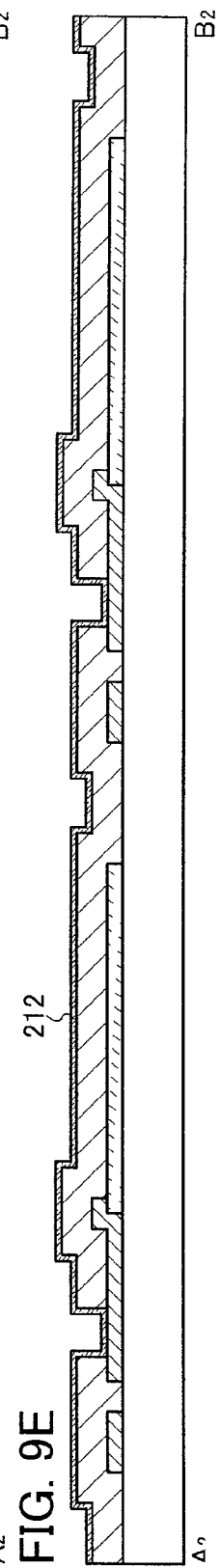

Next, a sacrificial layer 212 is formed over the insulating film 203 and the conductive film 202 in the opening 206 (see FIGS. 7D and 9E). The sacrificial layer refers to a layer to be removed in a later step, and by removing the sacrifice layer, a gap is formed. The sacrificial layer 212 can be formed of a material containing a metal element, a metal compound, silicon, a silicon oxide, or a silicon nitride. Here, for the sacrificial layer 212, a zinc oxide (ZnOx) or a zinc sulfide (ZnS) is formed by a sputtering method.

Next, the sacrificial layer 212 is selectively etched so that the sacrificial layer which is over the opening 206 and the insulating film 203 in the vicinity thereof remains. Here, an example in which etching is performed so that the sacrificial layer 213 remains is described (see FIGS. 7E and 10A).

Next, the conductive film 214 is formed over the remaining sacrificial layer 213 and the insulating film 203 (see FIGS. 8A and 10B). The conductive film 214 is formed by a CVD method, a sputtering method, or the like to have a single-layer structure or a stacked-layer structure using an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), and silicon (Si), or an alloy material or a compound material containing any of the above elements as its main component. Here, aluminum is used.

Next, the conductive film 214 is selectively removed by being etched. Here, an example where etching is performed so that the conductive film 205 remains is described (see FIG. 10C). Note that while an example where the conductive film 205 is provided over the opening 206 and the insulating film 203 in the vicinity thereof is described in this embodiment mode, it is also allowed that the conductive film 205 is not provided over the insulating film 203.

Next, the sacrificial layer 213 is selectively removed so that the gap 204 is formed in a portion where the sacrificial layer 213 had been provided, and thus the switching element 230 is obtained (see FIGS. 8B and 10D). Note that the sacrificial layer 213 may be removed at the same time that the conductive film 214 is removed. For example, in a case where a zinc oxide (ZnOx) is used for the sacrificial layer 213 and aluminum is used for the conductive film 214, wet etching is performed using an etching solution (for example, a mixed acid containing a nitric acid ($HNO_3$), an acetic acid ($CH_3COOH$), and a phosphoric acid ($H_3PO_4$)). At this time, an etching rate of ZnOx with respect to a mixed acid containing a nitric acid ($HNO_3$), an acetic acid ($CH_3COOH$), and a phosphoric acid ($H_3PO_4$) is extremely faster than (approximately two hundred times as fast as) that of aluminum; therefore, ZnOx can be removed at the same time that aluminum is etched.

Next, the insulating film 203 provided over the pixel electrode 211 is selectively removed so that an opening 215 is formed (see FIG. 10E). Note that the opening 215 may be formed at the same time that the opening 206 is formed (FIGS. 7C and 9D).

Figure 11A:
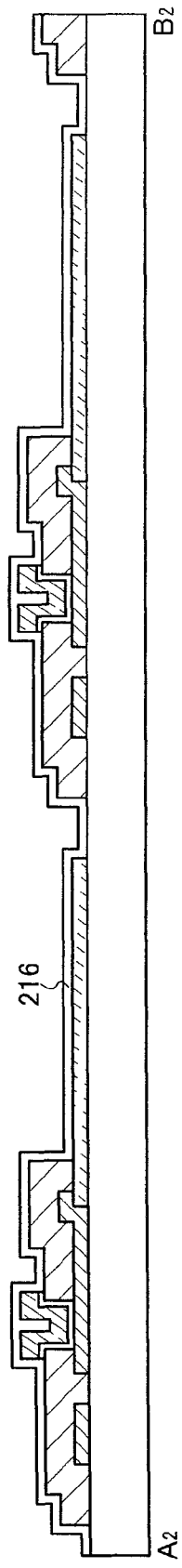
FIGS. 11A and 11B are diagrams showing an example of a method for manufacturing a display device of the present invention.

Next, an alignment film 216 is formed so as to cover the pixel electrode 211 and the like (see FIGS. 8C and 11A).

Figure 11B:
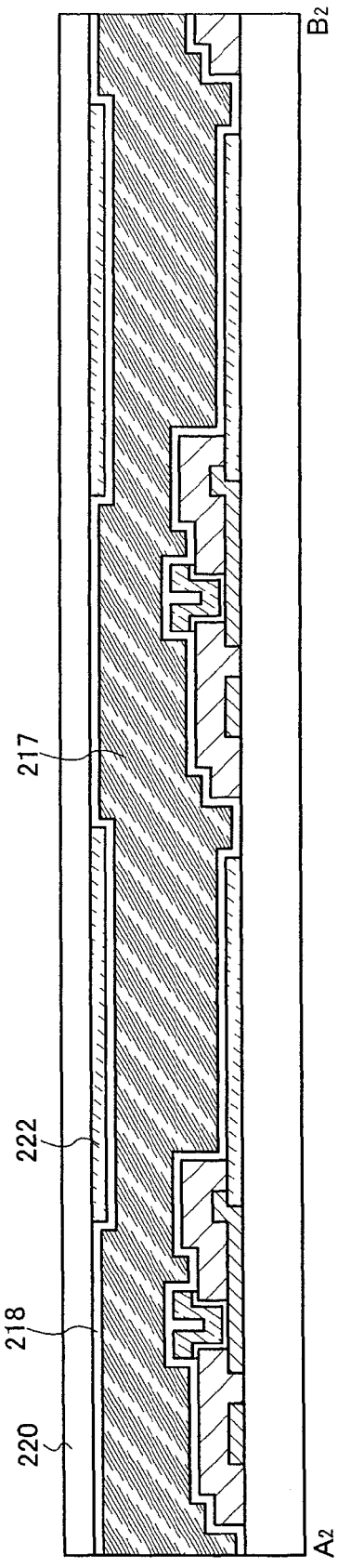

Next, the counter substrate 220, which is provided in advance with the conductive film 221, the counter electrode 222, and the alignment film 218, is attached to the substrate 200 with a space of several μm interposed therebetween and then a liquid crystal material 217 is injected between the substrate 200 and the counter substrate 220, so a display device can be obtained (see FIGS. 8D and 11B). Note that the counter substrate 220 which is provided with a light-shielding film, a color filter, a spacer, and the like may be used. Alternatively, another manufacturing method may be employed in which the alignment film 216 is formed, a spacer is formed and the liquid crystal material 217 is formed by liquid crystal dropping, and then the counter substrate 220 is attached to the substrate 200.

Hereinafter, a method for manufacturing the counter substrate 220 which is provided with the conductive film 221, the counter electrode 222, and the like is described with reference to FIGS. 12A to 12D.

Figure 12A:
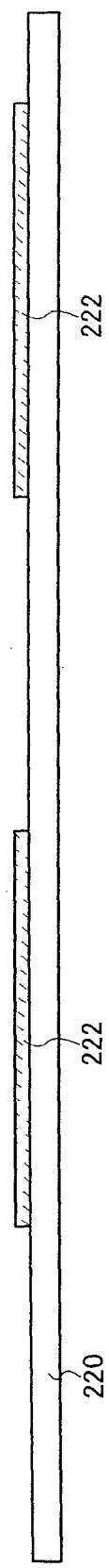
FIGS. 12A to 12D are diagrams showing an example of a method for manufacturing a display device of the present invention.
Figure 12B:
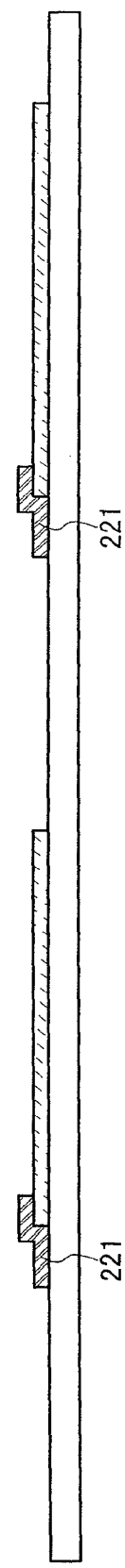

First, a plurality of the counter electrodes 222 are formed over the counter substrate 220 (see FIG. 12A). As the counter substrate 220, a light-transmitting substrate such as a glass substrate, a quartz substrate, or a plastic substrate can be used. For the counter electrode 222, an indium tin oxide (ITO) film in which indium oxide is added with tin oxide, an indium tin silicon oxide film in which indium tin oxide (ITO) is added with silicon oxide, an indium zinc oxide (IZO) film in which indium oxide is added with zinc oxide, a zinc oxide film, a tin oxide film, or the like can be used.

Next, the conductive film 221 is selectively formed over the counter substrate 220. The conductive film 221 is provided so as to be electrically connected to the counter electrode 222 (see FIG. 12B). The conductive film 221 can function as a data line in the display device.

The conductive film 221 is formed by a CVD method, a sputtering method, or the like to have a single-layer structure or a stacked-layer structure using an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), and silicon (Si), or an alloy material or a compound material containing any of the above elements as its main component. Alternatively, a droplet discharging method may be employed.

Note that while a case where the counter electrode 222 is formed and then the conductive film 221 is provided so as to be electrically connected to the counter electrode 222 is described here, it is also allowed that the conductive film 221 is formed and then the counter electrode 222 is formed.

Figure 12C:
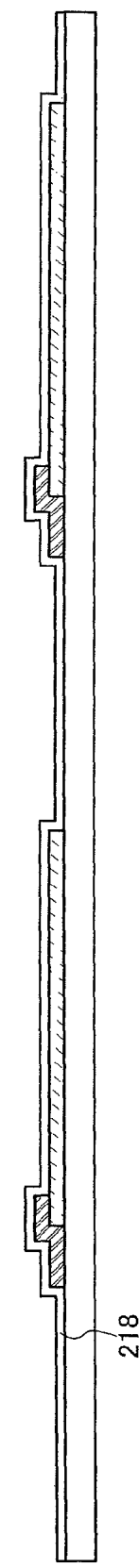
Figure 12D:
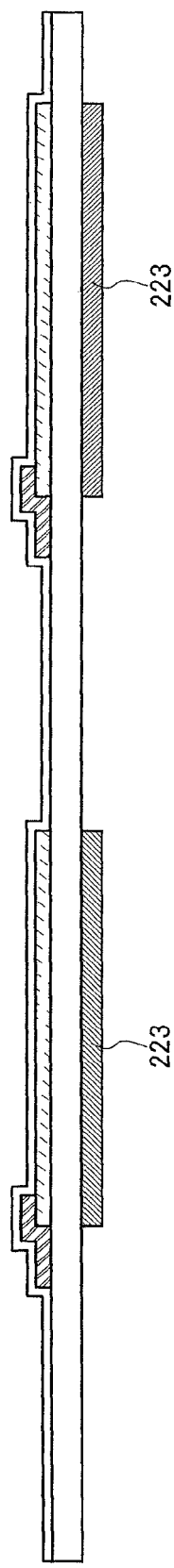

Next, the alignment film 218 is formed so as to cover the counter electrode 222 and the conductive film 221 (see FIG. 12C). Further, a color filter 223 may be provided so as to overlap with the counter electrode 222 (see FIG. 12D).

Through the above process, the display device can be obtained.

With the manufacturing method described in this embodiment mode, a step of crystallizing a semiconductor film or a step of introducing impurity elements is not performed; therefore, a manufacturing process can be simplified as compared to a manufacturing process of a display device using thin film transistors (TFTs). As a result, the display device can be manufactured at low cost.

Note that the switching element and the display device including the switching element, which are described above, can be implemented by being combined with any one of the structures of the switching element or the display device which are described in other embodiment modes in this specification.

Embodiment Mode 3

In this embodiment mode, a different method for manufacturing a switching element from the above embodiment mode is described with reference to the drawings. In specific, a case of forming a gap without using a sacrificial layer in the method for manufacturing a switching element is described.

In this embodiment mode, a gap is formed by applying volume contraction due to cohesion. Hereinafter, description is made with reference to FIGS. 13A to 14B.

Figure 13A:
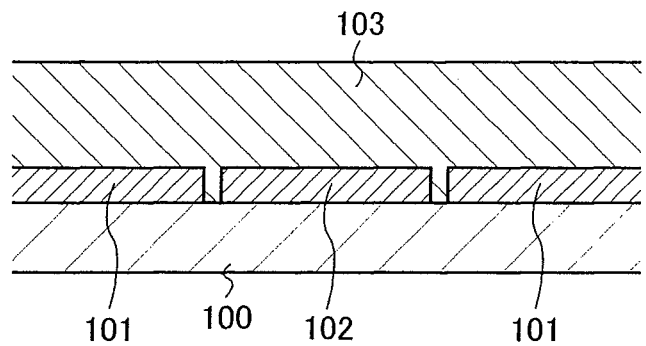
FIGS. 13A to 13C are diagrams showing an example of a method for manufacturing a display device of the present invention.

First, the first conductive film 101 and the second conductive film 102 are selectively formed over the substrate 100 and then the insulating film 103 which functions as a spacer layer is formed so as to cover the first conductive film 101 and the second conductive film 102 (see FIG. 13A).

Each of the first conductive film 101 and the second conductive film 102 is formed to have a single-layer structure or a stacked-layer structure using an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), and silicon (Si), or an alloy material or a compound material containing any of the above elements as its main component. Note that here, titanium (Ti) is formed for the first conductive film 101 and the second conductive film 102.

The insulating film 103 is formed to have a single-layer structure of a silicon oxide film, a silicon oxynitride film, a silicon nitride film, a silicon nitride oxide film, an aluminum nitride (AlNx) film, a lead zirconate titanate (PZT) film, a lithium niobate (LiNbO$_3$) film, a barium titanate (BaTiO$_3$) film, a lead titanate (PbTiO$_3$) film, a lead metaniobate (PbNb$_2$O$_6$) film, a zinc oxide (ZnO) film, or the like or a multilayer structure combining any of the above. Here, a silicon nitride (SiNx) film is formed as the insulating film 103.

Figure 13B:
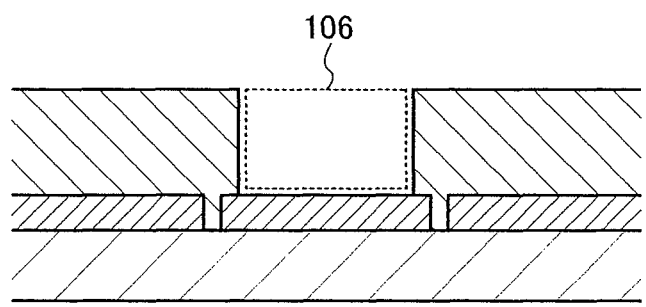

Then, the insulating film 103 is selectively etched so that at least part of the second conductive film 102 is exposed and thus the opening 106 is formed (see FIG. 13B).

Figure 13C:
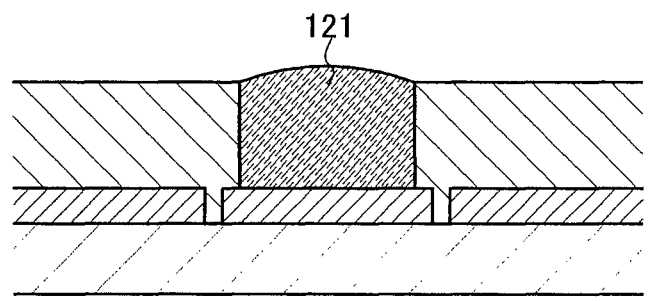

Then, a conductor 121 is selectively formed in the opening (see FIG. 13C). The conductor 121 can be formed using conductive particles of silver (Ag), copper (Cu), nickel (Ni), or the like. Note that here, nanoparticles of silver (Ag) are selectively formed in the opening 106 by a droplet discharging method.

Figure 14A:
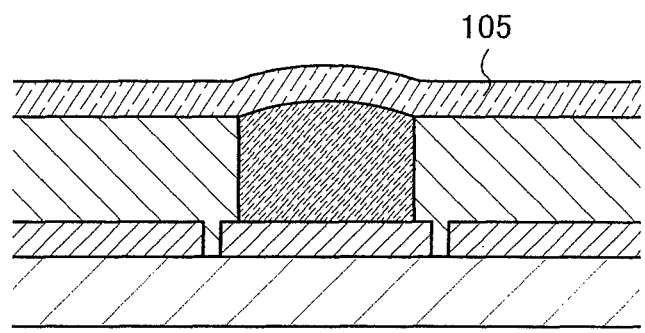
FIGS. 14A and 14B are diagrams showing an example of a method for manufacturing a display device of the present invention.

Then, the third conductive film 105 is selectively formed so as to cover the conductor 121 formed in the opening 106 (see FIG. 14A). The third conductive film 105 is formed to have a single-layer structure or a stacked-layer structure using an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), and silicon (Si), or an alloy material or a compound material containing any of the above elements as its main component. Note that here, molybdenum (Mo) is formed for the third conductive film 105.

Figure 14B:
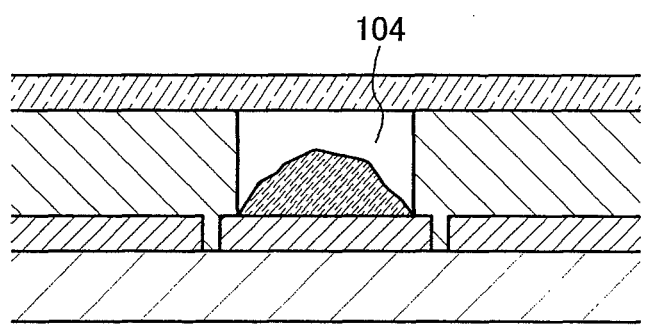

Then, the conductor 121 is aggregated by heat treatment, so that the gap 104 is formed between the conductor 121 and the third conductive film 105 (see FIG. 14B). Here, heat treatment is performed at 200 to 600° C. in a nitrogen atmosphere to remove an organic film covering nanoparticles of Ag, so that Ag aggregates. In this case, having high adhesion to titanium (Ti) of the first conductive film 101, nanoparticles of Ag have low adhesion to molybdenum (Mo) of the third conductive film 105; therefore, when Ag aggregates and the volume thereof is reduced, the gap 104 is formed between the conductor 121 and the third conductive film 105. Thus, the switching element can be manufactured.

With the manufacturing method described in this embodiment mode, a gap can be formed without using a sacrificial layer. Therefore, a manufacturing process can be simplified.

Note that the method for manufacturing a switching element, which is described in this embodiment mode, can be implemented by being combined with any one of the methods for manufacturing a switching element or a display device including a switching element which are described in other embodiment modes in this specification.

Embodiment Mode 4

In this embodiment mode, the structure of a different switching element from the above embodiment mode is described with reference to the drawings.

Figure 15A:
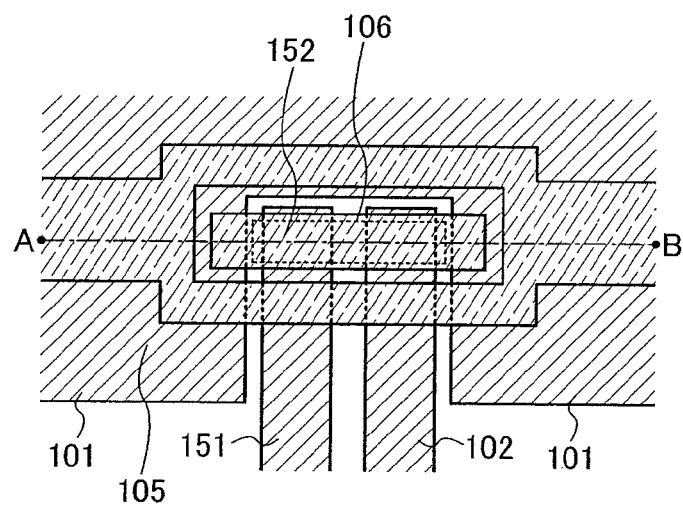
FIGS. 15A to 15C are diagrams each showing a structure of a switching element of a display device of the present invention.
Figure 15B:
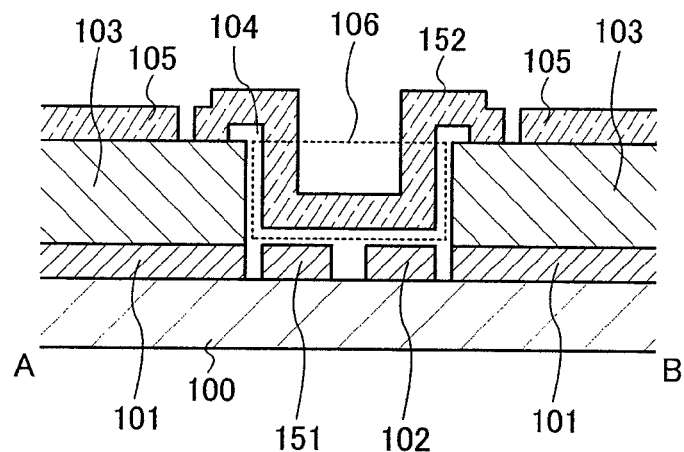

The switching element described in this embodiment mode includes the first conductive film 101, the second conductive film 102, and a fourth conductive film 151 which are provided over the substrate 100, the insulating film 103, the gap 104, the third conductive film 105, and a fifth conductive film 152 (see FIGS. 15A and 15B). The structure shown in FIGS. 15A to 15C differs from the structure shown in FIGS. 1A to 1C in that the fourth conductive film 151 which can function as a data line is arranged in parallel with the second conductive film 102, and the fifth conductive film 152 which is electrically independent is provided so as to overlap with the second conductive film 102 and the fourth conductive film 151.

In specific, the first conductive film 101, the second conductive film 102, and the fourth conductive film 151 are arranged over the substrate 100, the fifth conductive film 152 is provided at least over the second conductive film 102 and the fourth conductive film 151, and the third conductive film 105 is provided at least over the first conductive film 101. The insulating film 103 is provided at least between the first conductive film 101 and the third conductive film 105, and the opening 106 is formed in part or all of a portion where the fifth conductive film 152 overlaps with the second conductive film 102 and the fourth conductive film 151.

Further, in the opening 106, the gap 104 is formed between the second conductive film 102 and the fifth conductive film 152 and between the fourth conductive film 151 and the fifth conductive film 152.

The switching element shown in FIGS. 15A to 15C functions as a switch in the following manner. The insulating film 103 expands and contracts so that contact or non contact operation is performed between the fifth conductive film 152, and the second conductive film 102 and the fourth conductive film 151 (FIG. 15C).

For example, in a case where the potential of the first conductive film 101 is $V_{com}$, the potential of the fourth conductive film 151 is $V_{sig}$, and a potential $V_{in}$ ($V_{in} \neq V_{com}$) is applied to the third conductive film 105, a charge is induced on the first conductive film 101 and the third conductive film 105 which sandwich the insulating film 103 and thus compressive stress is caused to the insulating film 103 so that the insulating film 103 contracts. As a result, the fifth conductive film 152, which is provided so as to be electrically independent, comes in contact with the second conductive film 102 and the fourth conductive film 151, and the potential $V_{sig}$ of the fourth conductive film 151 is applied to the second conductive film 102.

Thus, the insulating film provided between the conductive films expands and contracts so that switching operation (contact or noncontact operation) is performed; therefore, stress is not concentrated in a portion of the switching element, and damage to the element can be prevented. Even in a case where contact and noncontact operations are repeated, rebound of the fifth conductive film 152 and deterioration of the element can be prevented, and thus reliability of the switching element can be improved. Since expansion and contraction in up and down directions of the insulating film 103 are utilized, it is not necessary for the gap 104 to be wide and the switching element can be miniaturized. Further, when the switching element is off, a potential difference between a conductive film, which corresponds to an upper electrode, and a conductive film, which corresponds to a lower electrode, is set to be approximately constant, so that malfunctioning of the switching element can be prevented even in the case where the switching element is driven with low power consumption.

Figure 15C:
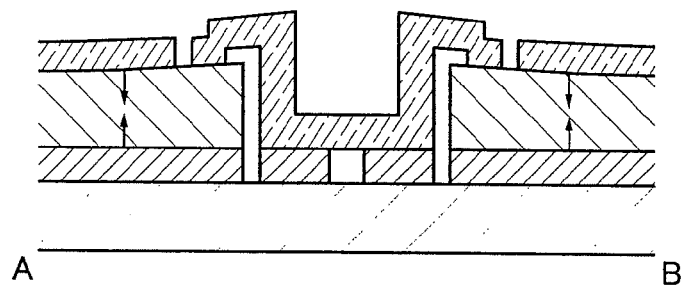
Figure 16:
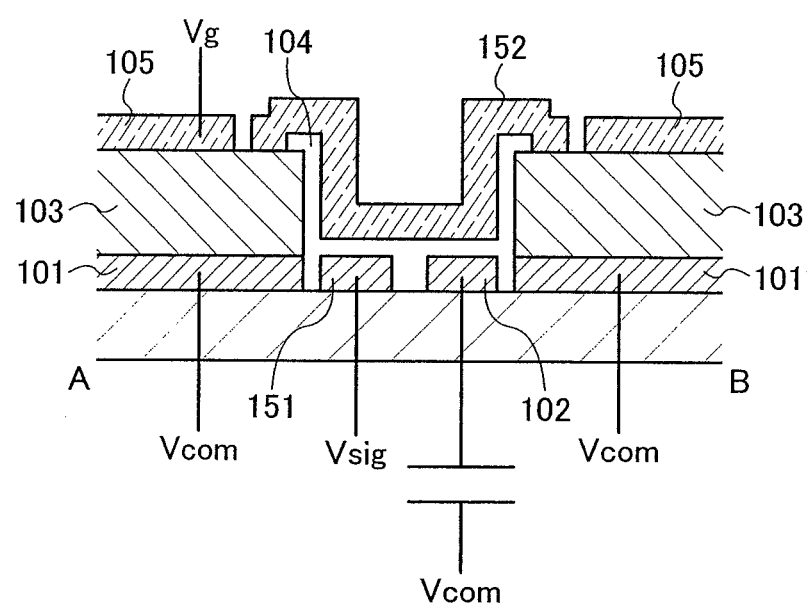
FIG. 16 is a diagram showing a driving method of a display device of the present invention.

Next, an example of a method for driving a display device using the switching element shown in FIGS. 15A to 15C is described below with reference to FIG. 16. FIG. 16 shows a schematic diagram of a driver circuit of the display device using the switching element shown in FIGS. 15A to 15C. Here, a case is described where a pixel electrode is connected to the second conductive film 102 and a counter electrode provided so as to face the pixel electrode holds a constant potential ($V_{com}$).

First, the first conductive film 101 which can function as a common line holds a common line potential $V_{com}$ and a gate line potential $V_g$ is applied to the third conductive film 105 which can function as a gate line, so the switching element is turned on (the fifth conductive film 152 comes to be in contact with the second conductive film 102 and the fourth conductive film 151). Note that the data line potential $V_{sig}$ is applied to the fourth conductive film 151 which can function as a data line.

In this case, $V_{sig}$ is applied to the pixel electrode connected to the second conductive film 102 from the fourth conductive film 151 through the fifth conductive film 152, and thus a potential of ($V_{com}-V_{sig}$) is applied to a display element provided between the pixel electrode and the counter electrode. As a result, in a case of providing a liquid crystal material for a display element, the alignment of liquid crystals varies in accordance with the potential of ($V_{com}-V_{sig}$).

Next, the potential of the third conductive film 105 is made equal to the common line potential $V_{com}$, so the switching element is turned off (the fifth conductive film 152 cease to be in contact with the second conductive film 102 and the fourth conductive film 151). When the switching element is off, the second conductive film 102 and the pixel electrode are in a floating state; therefore, the potential difference of ($V_{com}-V_{sig}$) is maintained until the switching element is next turned on.

Thus, by using the switching element, the alignment of the liquid crystal materials of each pixel provided in the display device can be controlled. Further, the potential of ($V_{com}-V_{sig}$) applied to the liquid crystal material is varied by changing $V_{sig}$, and thus analog gray-scale display is possible.

Note that although a case of using a liquid crystal material for the display element in the structure of the display device described and shown in Embodiment Modes 1 to 3 and FIG. 16 is described, a display device to which the switching element described in this specification can be applied is not limited to a liquid crystal display device. For example, the switching element can be applied to a display device using an organic EL material or an inorganic EL material as a display element.

In the case of using an inorganic EL material for the display element, a driving voltage is comparatively high (100 to 200 V); therefore, there is a problem such as breakage in a case of applying a thin film transistor (TFT) as the switching element. However, by applying the switching element described in this specification, the switching element is prevented from being broken and a highly reliable display device can be provided even in the case where a driving voltage is high.

Further, the switching element described in this specification can be applied to a memory element such as a DRAM (dynamic random access memory) as well as a display device. In this case, a capacitor is provided instead of a pixel electrode for the second conductive film 102 in the structure described in any of Embodiment Modes 1 to 4 and this embodiment mode, so that a memory element can be formed. Further, a charge accumulation layer which can hold a charge is connected to the second conductive film 102, and thus the second conductive film 102 can be applied as a memory element depending on whether a charge is in an accumulation state or not.

Note that the switching element and the display device including the switching element, which are described above, can be implemented by being combined with any one of the structures of the switching element or the display device which are described in other embodiment modes in this specification.

Embodiment Mode 5

The display device of the present invention can be applied to various electronic appliances, specifically, a display portion of electronic appliances. The electronic appliances include cameras such as a video camera and a digital camera, a goggle-type display, a navigation system, an audio reproducing device (a car audio component stereo, an audio component stereo, or the like), a computer, a game machine, a portable information terminal (a mobile computer, a mobile phone, a mobile game machine, an electronic book, or the like), an image reproducing device having a recording medium (specifically, a device for reproducing a recording medium such as a digital versatile disc (DVD) and having a display device for displaying the reproduced image) and the like.

Figure 17A:
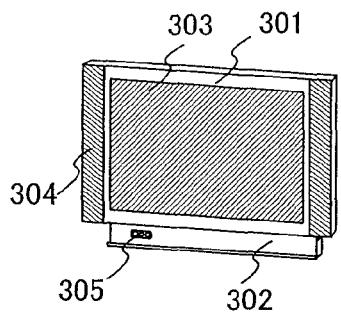
FIGS. 17A to 17H are diagrams each showing an application mode of a display device of the present invention.

FIG. 17A shows a TV set which includes a housing 301, a supporting base 302, a display portion 303, a speaker portion 304, a video inputting terminal 305, and the like. The switching element described in any of the above embodiment modes can be used to drive the display portion 303. Note that the TV set includes all light-emitting devices for displaying information for a personal computer, for receiving television broadcasting, for displaying an advertisement, and the like.

Figure 17B:
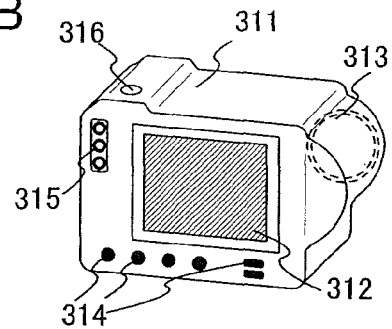

FIG. 17B shows a camera which includes a main body 311, a display portion 312, an image receiving portion 313, operation keys 314, an external connection port 315, a shutter button 316, and the like. The switching element described in any of the above embodiment modes can be used for display portion 312.

Figure 17C:
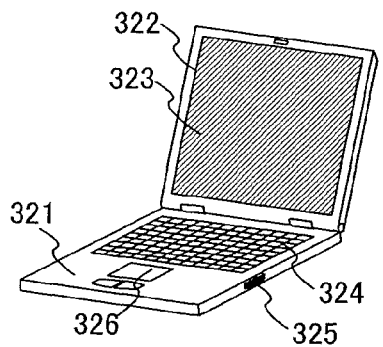

FIG. 17C shows a computer which includes a main body 321, a housing 322, a display portion 323, a keyboard 324, an external connection port 325, a pointing device 326, and the like. The switching element described in any of the above embodiment modes can be used to drive the display portion 323.

Figure 17D:
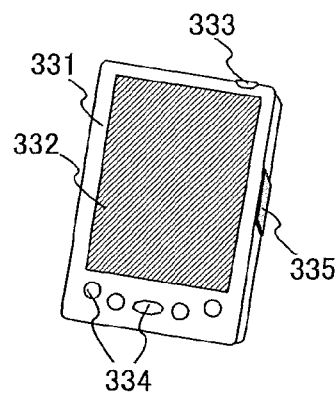

FIG. 17D shows a mobile computer which includes a main body 331, a display portion 332, a switch 333, operation keys 334, an infrared port 335, and the like. The switching element described in any of the above embodiment modes can be used to drive the display portion 332.

Figure 17E:
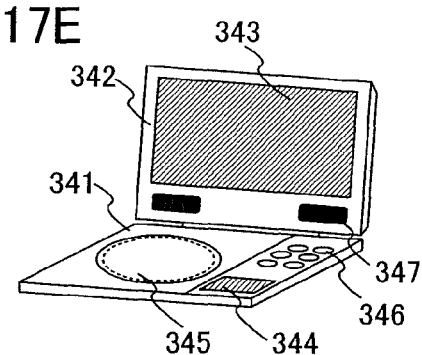

FIG. 17E shows a portable image reproducing device having a recording medium (in specific, a DVD reproducing device), which includes a main body 341, a housing 342, a display portion A 343, a display portion B 344, a recording medium (DVD or the like) reading portion 345, an operation key 346, a speaker portion 347, and the like. The display portion A 343 mainly displays image data and the display portion B 344 mainly displays text data. The switching element described in any of the above embodiment modes can be used to drive the display portions A 343 and B 344.

Figure 17F:
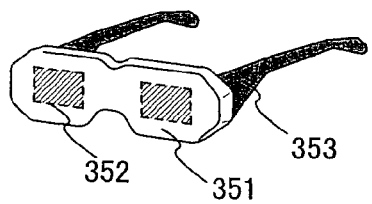

FIG. 17F shows a goggle-type display which includes a main body 351, a display portion 352, and an arm portion 353. The switching element described in any of the above embodiment modes can be used to drive the display portion 352.

Figure 17G:
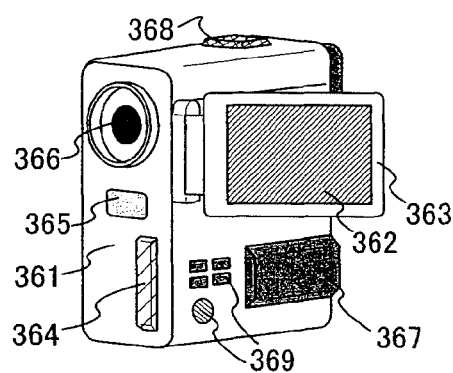

FIG. 17G shows a video camera which includes a main body 361, a display portion 362, a housing 363, an external connection port 364, a remote control receiving portion 365, an image receiving portion 366, a battery 367, an audio inputting portion 368, operation keys 369, and the like. The switching element described in any of the above embodiment modes can be used to drive the display portion 362.

Figure 17H:
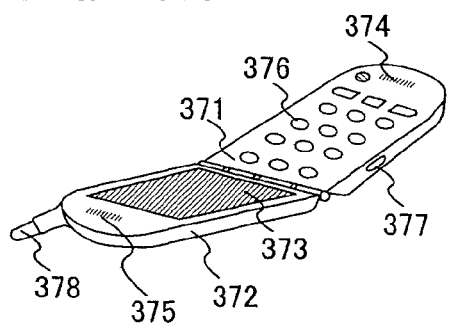

FIG. 17H shows a mobile phone which includes a main body 371, a housing 372, a display portion 373, an audio input portion 374, an audio output portion 375, operation keys 376, an external connection port 377, an antenna 378, and the like. The switching element described in any of the above embodiment mode can be used to drive the display portion 373.

Thus, the present invention can be applied to various electronic appliances each including a switch.

This application is based on Japanese Patent Application serial no. 2007-078558 filed with Japan Patent Office on Mar. 26, 2007, the entire contents of which are hereby incorporated by reference.

What is claimed is:

1. A method for manufacturing a switching element comprising:
    forming a first conductive film and a second conductive film over a substrate;
    forming a spacer layer so as to cover the first conductive film and the second conductive film;
    selectively forming an opening in the spacer layer to expose at least a part of the second conductive film;
    forming a conductor in the opening;
    forming a third conductive film so as to cover the spacer layer and the conductor; and
    making a conductor aggregate by a heat treatment so that a gap is formed between the conductor and the third conductive film,
    wherein a piezoelectric material is used for the spacer layer.

2. The method for manufacturing a switching element according to claim 1, wherein any one of a crystal ($SiO_2$) film, a lead zirconate titanate (PZT) film, a lithium niobate ($LiNbO_3$) film, a barium titanate ($BaTiO_3$) film, a lead titanate ($PbTiO_3$) film, a lead metaniobate ($PbNb_2O_6$) film, and a zinc oxide (ZnO) film is used as the piezoelectric material.

3. A method for manufacturing a switching element comprising:
    forming a first conductive film and a second conductive film over a substrate;
    forming a spacer layer so as to cover the first conductive film and the second conductive film;
    selectively forming an opening in the spacer layer to expose at least a part of the second conductive film;
    forming a conductor in the opening;
    forming a third conductive film so as to cover the spacer layer and the conductor; and
    making a conductor aggregate by a heat treatment so that a gap is formed between the conductor and the third conductive film,
    wherein nanoparticles of silver are used for the conductor, and
    wherein a piezoelectric material is used for the spacer layer.

4. The method for manufacturing a switching element according to claim 3, wherein any one of a crystal ($SiO_2$) film, a lead zirconate titanate (PZT) film, a lithium niobate ($LiNbO_3$) film, a barium titanate ($BaTiO_3$) film, a lead titanate ($PbTiO_3$) film, a lead metaniobate ($PbNb_2O_6$) film, and a zinc oxide (ZnO) film is used as the piezoelectric material.

* * * * *